United States Patent [19]

Oldham

[11] 4,450,537
[45] May 22, 1984

[54] MONOLITHICALLY INTEGRATED READ-ONLY MEMORY

[75] Inventor: William G. Oldham, El Cerrito, Calif.

[73] Assignee: Siemens Aktiengesellschaft, Berlin & Munich, Fed. Rep. of Germany

[21] Appl. No.: 294,303

[22] Filed: Aug. 19, 1981

[51] Int. Cl.³ .................. G11C 11/40; G11C 7/00
[52] U.S. Cl. .................................. 365/217; 365/104; 340/825.91
[58] Field of Search ............... 365/128, 104, 184, 185, 365/217; 357/23 VT; 340/825.91

[56] References Cited

U.S. PATENT DOCUMENTS

| | | | |
|---|---|---|---|
| 3,648,258 | 3/1972 | Sewell | 365/184 |
| 3,721,962 | 3/1973 | Foster et al. | 365/184 |
| 3,876,991 | 4/1975 | Nelson et al. | 365/184 |
| 4,173,791 | 11/1979 | Bell | 365/184 |
| 4,242,737 | 12/1980 | Bate | 365/184 |

OTHER PUBLICATIONS

"Siemens Forschungs-u. Entwicklungsbericht", vol. 4, 1975, Nr. 6, pp. 345–351.
"Semiconductor Memory Design and Application" 1973, pp. 154–155 and 168–169.
"Techn. Rundschau" 35, 1975/76, Nr. 3, pp. 72–84, A Users Handbook of Semiconductor Memories, 1977, pp. 242–245 and 248, 249.

*Primary Examiner*—Stuart N. Hecker
*Attorney, Agent, or Firm*—Hill, Van Santen, Steadman & Simpson

[57] ABSTRACT

A monolithically integrated read-only memory has a plurality of word lines, read lines which cross the word lines to form intersections, and field effect transistors connected to the read and word lines, these transistors being selectable via the word lines and functioning as coupling elements between the read lines and circuit point carrying a reference potential. Means are provided for selectively altering a charge state of a gate insulating layer of transistors at certain predetermined selected intersections, the altered charge states changing a threshold voltage of the transistor so as to determine whether or not it is employed as a coupling element. Preferably electron beam scanning is employed to change the charge state of the gate.

8 Claims, 5 Drawing Figures

MONOLITHICALLY INTEGRATED READ-ONLY MEMORY

BACKGROUND OF THE INVENTION

The invention refers to a monolithically integrated read-only memory having a plurality of word lines, a plurality of read lines which cross the word lines to form intersections, and wherein the read lines are connected via load elements to a supply voltage. At the intersections, field effect transistors are connected to the read and word lines, the transistors being selectable via the word lines and functioning as coupling elements between the read lines and a circuit point carrying a reference potential.

Such a read-only memory (ROM) is known from the book by Luecke, Mize and Carr "Semiconductor Memory Design and Application", McGraw-Hill Publishing Company Kogakusha Ltd., Tokyo, 1973, pp 154–155, in particular FIG. 6.15, incorporated herein by reference. Here, however, field effect transistors serving as coupling elements are provided only at selected intersections and not at the remaining ones. The selection of the intersections or, respectively the programming of the read-only memory, thus requires a corresponding design of those masks which are used in the definition of the field effect transistors. In accordance with this, the programming takes place before the application of the metallizations.

On pages 168 and 169 of the above-identified publication, other programmable read-only memories are described whose coupling elements are connected in series with connection members which can be interrupted for programming in order to render the specific coupling elements ineffective. The connection members however considerably increase the surface requirements on the semiconductor.

SUMMARY OF THE INVENTION

It is an object of the invention to provide a read-only memory of the above discussed type whose coupling elements can be provided in a simple manner without a significant enlargement of the surface requirement even after the application of the metallization plane so that the manufacturing process, including definition of the metallic coatings, is not influenced by such application.

According to the invention, in the read-only memory previously described, means are provided for selectively altering a charge state of the gate insulating layers of the transistors at certain predetermined selected intersections, the altered charge states changing a threshold voltage of the transistor so as to determine whether or not it can function as a coupling element.

DESCRIPTION OF THE PREFERRED EMBODIMENTS

Figure 1:
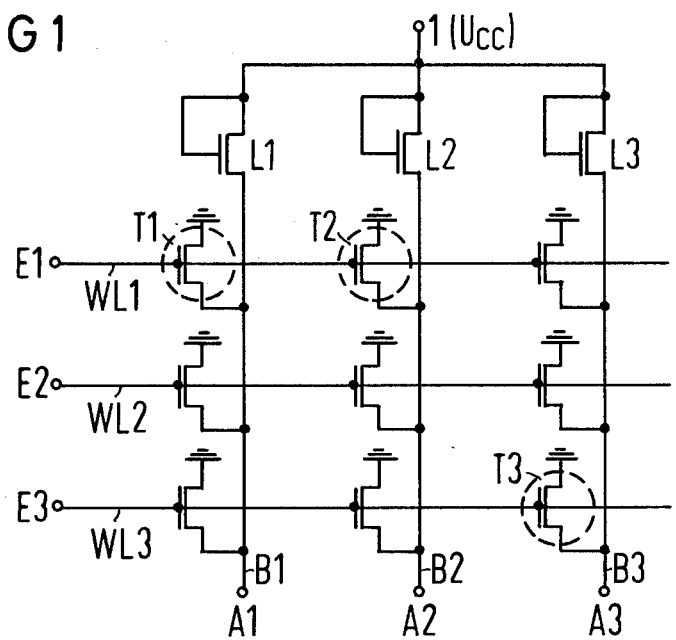
FIG. 1 shows a schematic diagram of a read-only memory designed according to the invention.

In FIG. 1, the schematic diagram of a read-only memory matrix is shown which incorporates three word lines parallel to one another WL1–WL3, and three reading lins B1–B3 which cross these word lines. The word lines WL1 through WL3 have on the left side connection leads E1–E3 which are connected with corresponding outputs of a line selection circuit which is not depicted, for example a word decoder. The reading lines B1–B3 which also are designated as bit lines are connected via load elements L1–L3 with a lead connection 1 which is connected with a supply voltae $U_{cc}$. The load elements thereby consist, for example, of field effect transistors of the depletion type whose gate electrodes are connected with their drain terminals. The lower ends of the reading lines B1–B3 are connected with the outputs A1–A3 of the read-only memory matrix. At all intersections between the lines WL1–WL3 and B1–B3, field effect transistors are provided. Of these, the transistor located at the intersection of WL1 and B1 is designated with T1. Its gate electrode is connected with the word line W11, its drain terminal with the reading line B1, and its source lead terminal with a circuit point lying at reference potential.

In FIG. 1, one proceeds from the fact that the read-only memory matrix is programmed such that the transistors indicated with T1, T2 and T3 (provided with broken line boundaries) serve as coupling elements. However, the remaining transistors do not. In this case, a first binary signal delivered by the line selection circuit fed to the lead connection E1, for example a logic "1", has the effect that the transistors T1 and T2 are transferred into the conducting state. Accordingly, the reading lines B1 and B2 are placed via T1 and T2 in each case at the reference potential so that a second binary signal, in this case a logic "0", occurs at the outputs A1 and A2 in each case, while the reading line B3 lies approximately at the voltage $U_{cc}$. If, on the other hand, a first binary signal "1" is received at the input E3, then only at the output A3 does a corresponding second binary signal "0" occur while the lines B1 and B2 remain approximately at the voltage $U_{cc}$. With selection of the input E2, all reading lines B1–B3 and thus all outputs A1–A3 remain approximately at the supply voltage $U_{cc}$ since no coupling elements are selectable via WL2.

It must now be assured that despite the field effect transistors provided at all intersections, only the transistors T1, T2 and T3 act as coupling elements. For this purpose, the threshold or cut-off voltages of T1, T2 and T3 are shifted with respect to the threshold voltages of the remaining transistors as will be explained below in detail with the use of transistor T1 depicted in FIG. 2 in cross-section.

$T_1$ is integrated in a semiconductor body 2 consisting of, for example, silicon, and in the case of a p-doping of the same, is designed as a N-channel MIS structure of the enhancement type. By MIS structure, in general a structure is understood which encompasses a semiconductor body and a metal layer separated from the body by means of an electrically insulating layer. T1 has $n^+$-doped source and drain regions designated in FIG. 2 with 3 and 4 which are introduced in the semiconductor body 2, which extend up to the interface 2a of the semiconductor body 2, and which are provided with lead terminals 5 and 6. Between the regions 3 and 4 at the interface 2a there is located the channel region 7 which is covered by a metallically conducting gate electrode 8 separated from the interface 2a by means of a gate-insulating layer 9, for example $SiO_2$. The gate electrode 8 has a lead connection 10.

Figure 2:
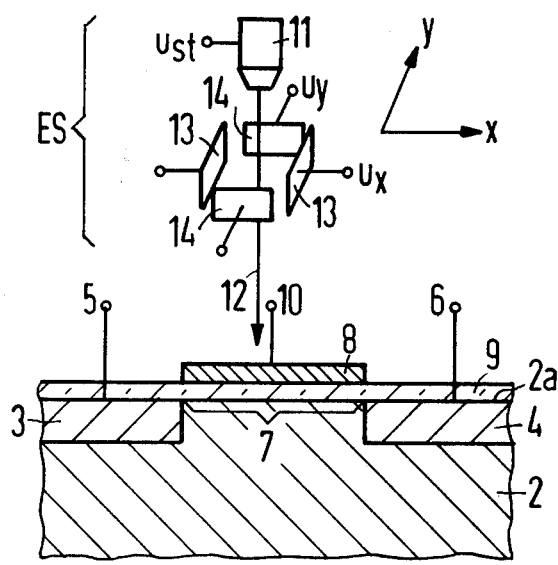
FIG. 2 shows in cross-section a portion of a semiconductor circuit of FIG. 1.

In FIG. 2 an electron beam writer ES is indicated which is provided with an electron gun 11. An electron beam 12 exiting therefrom is deflected in the directions x and y with the pairs of plates 13 and 14, which in each case are connected with voltages $u_x$ and $u_y$. The sharply focused electron beam 12 now scans over, in dependence upon the voltages $u_x$ and $u_y$, the surface of the semiconductor body 2, for example in individual lines running parallel to one another. An electron beam writer of this sort equipped with magnetic deflection systems rather than electrostatic systems 13, 14 is known from the magazine Philips Techn. Survey 35, 1975/76, No. 3, pp. 72–84, in particular page 73, FIG. 1, incorporated herein by reference.

The electron beam 12 is switched on by means of a supplied control voltage $u_{st}$ in each case only when it is just scanning over the channel region 7. In the case of a current density of the electron beam 12 of, for example, 1 $A/cm^2$, an acceleration voltage of approximately 25 keV and a local influence duration of approximately $10^{-6}$ seconds, charge carrier pairs form in the gate insulating layer 9. As to these charge carrier pairs, in each case the negative charge carriers flow off into the semiconductor body 2 connected with a reference potential while the positive charge carriers remain in the gate insulating layer 9 and charge this positively. A charging of almost the same size results, however, also for a current density of 100 $A/cm^2$ and an influence duration of $10^{-8}$ seconds with an acceleration voltage which remains the same. From this it is apparent that the size of the positive charging essentially depends upon the product of current density and influence duration. The number of values given are, however, only examples and can be varied within the framework of the invention depending upon the size of the desired positive charge.

By means of the positive charging of the gate insulating layer 9, the threshold voltage $U_t$ of the N-channel transistor T1 shifts to a lower value. In a similar manner then, the threshold voltages of T2 and T3 are shifted. If the threshold voltages of T1, T2 and T3, for example, lie at 1 V while those of the remaining transistors amount approximately to 10 V, and if the selection takes place at the lead connections E1–E3 with approximately 5 V (logic "1") or, respectively, 0 V (logic "0"), than in the case of a supply voltage $U_{cc}$ of for example 12 V, the previously described linkages between the signals is attained at E1 through E3 and at A1 through A3.

A selective shifting of the threshold voltages of T1, T2 and T3 can also proceed in this manner. First the threshold voltages of all field effect transistors are shifted to a lower value in each case by means of a common irradiation with x-rays or with the electron beam of an electron beam writer whose current density, influence duration, and acceleration voltage are selected in the described manner. Following this, an additional selective irradiation of the channel regions of the transistors not circled in FIG. 1, and whose threshold voltages are not to be changed, takes place with an electron beam 12 of very great power density. This power density is selected such that the gate insulating layer 9 of the last-named transistors in each case heats up to a temperature of approximately 500° to 600° C. whereby the stored positive charge carriers flow off into the semiconductor body 2 so that the gate insulating layer is again discharged and the original value of the threshold voltage is again attained. Here, for example, a current density of 100 to 500 $A/cm^2$ and a local influence duration of $10^{-4}$ seconds come into consideration with an acceleration voltage of 25 keV.

Figure 3:
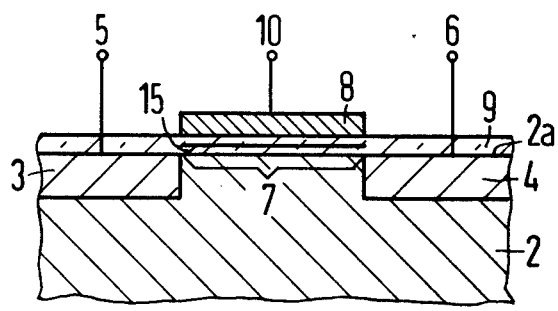
FIG. 3 shows a first alternative embodiment of the circuit portion of FIG. 2.
Figure 4:
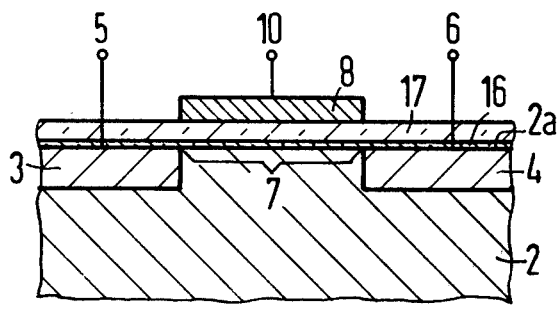
FIG. 4 shows a second alternative embodiment of the circuit portion of FIG. 2.

Advantageous further developments of the field effect transistors are depicted in the FIGS. 3 and 4. In FIG. 3, a polysilicon layer 15 which is connected free of exterior potentials and this is located in a "floating" state, is introduced into the gate insulating layer 9. According to FIG. 4, the gate insulating layer 9 is comprised of two different partial layers, for example of a $SiO_2$ layer 16 and a $Si_3N_4$ layer 17 lying thereover. In the case of these embodiments, the charge states of the gate insulating layers are stabilized in each case by means of the conducting layer 15 or by means of the interfaces between the partial layers 16 and 17.

Another possibility for programming the read-only memory matrix according to FIG. 1 is the threshold voltages of the field effect transistors not designated in FIG. 1 are shifted by means of a negative charging of their gate insulating layers in the direction toward larger values. For this purpose, advantageously transistors further developed according to the FIGS. 3 or 4 are used whose polysilicon layers 15 or their interfaces between the partial layers 16 and 17 are negatively charged in the customary manner. Such a negative charging is for example described in "A Users Handbook of Semiconductor Memories" by E. R. Hnafek, John Wiley & Sons Publishing Company, New York, 1977, pages 242–245 and 248, 249 or in the Siemens Research and Development Reports, Vol. 4 (1975), No. 6, pages 345–351, both incorporated herein by reference. In many cases, it will be practical first to negatively charge the gate insulating layers of all transistors in this manner and following this to undertake a selective irradiation of the channel regions 7 of the transistors T1, T2 and T3 with the electron beam 12 whose current density, influence duration, and acceleration voltage are selected in the manner already described so that the gate insulating layers of T1, T2 and T4 heat up to a temperature allowing their discharge. Accordingly, these transistors again assume their original threshold voltages while the displacement of the threshold voltages of all transistors not designated in FIG. 1 is preserved at a higher value.

Figure 5:
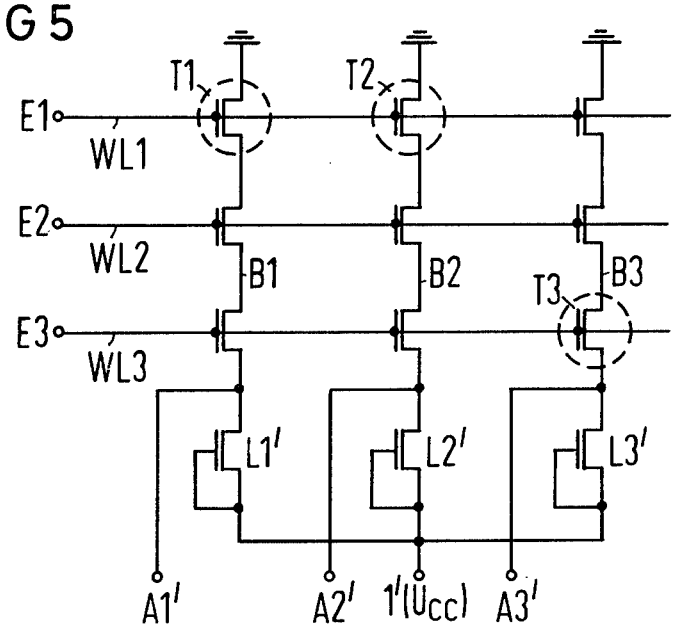
FIG. 5 shows the schematic diagram of an alternate embodiment read-only memory designed according to the invention.

In FIG. 5, the connection diagram of a further read-only memory matrix designed according to the invention is depicted which permits a still higher packing density on the semiconductor body 2 than the matrix according to FIG. 1. Differently from FIG. 1, the reading lines B1–B3 on their lower ends are provided with load elements L1'–L3' which in particular are designed as field effect transistors of the enhancement type with gate and drain lead terminals connected with one another. The drain lead terminals of L1'–L3' are directed to a common lead connection 1' which is connected with the supply voltage $U_{cc}$. The upper ends of the reading lines B1–B3 lie at reference potential while the matrix outputs A1'–A3' are connected to the ends of the load elements L1'–L3' at the side of the intersections. The field effect transistors at the intersections are introduced with their source-drain paths in each case into the corresponding reading lines B1–B3 while their gate electrodes as in FIG. 1 are connected with the associated word lines WL1-WL3. In the case of a selection via E1-E3 with 0 V (logic "0") or 5 V (logic "1"), the word line selected in each case, for example WL1, has 0 V thereon. Since T1 and T2 again are to serve as coupling elements, their threshold voltages (just like those of T3) are displaced to approximately $-10$ V while those of the remaining transistors lie at $+1$ V. In accordance with this, T0 and T1 are put into the conducting state while the field effect transistor at the intersection of WL1 and B3 is blocked. Since the non-selected word lines WL2 and WL3 lie at $+5$ V, the transistors thereby selectable are connected to be conducting. The outputs A1' and A2' are thus placed at reference potential in the case of a selected word line WL1 while the output A3' lies approximately at the voltage $U_{cc}$. If WL2 is selected, then all outputs A1'-A3' lie at $U_{cc}$, while in the case of the selection of WL3, only A3' lies at the reference potential while A1' and A2' are connected with $U_{cc}$.

For the case when the semiconductor body 2 is n-doped and the field effect transistors are realized as P-channel MIS structures, their threshold voltages in each case must be displaced in the opposing direction. For this, one can draw upon the techniques already described if one keeps in mind that the techniques previously described for transistors T1-T3 now are to be used on the transistors not designated in FIG. 1 or FIG. 5 and conversely.

Although various minor modifications may be suggested by those versed in the art, it should be understood that I wish to embody within the scope of the patent warranted hereon, all such embodiments as reasonably and properly come within the scope of my contribution to the art.

I claim as my invention:

1. A monolithically integrated read-only memory system, comprising: a plurality of word lines, a plurality of read lines which cross the word lines to form intersections; the read lines being connected via load elements with a supply voltage; field effect transistors connected to the read and word lines at the intersections, the transistors being connected to be selectable via the word lines and to function as coupling elements between the read lines and a circuit point carrying a reference potential; the field effect transistors being formed of gate insulating layers on a semiconductor body connected to a reference voltage; means for selectively altering a charge state of the gate insulating layers of the transistors at certain predetermined intersections so as to program the entire memory system prior to use and application of specific control voltages to the intersection transistors in read-only memory fashion, the altered charge states changing a threshold voltage of the transistor so as to determine whether or not it can be employed as a coupling element; and said means for selectively altering comprising a scanning electron beam which scans over all of the intersection transistors on the semiconductor body along individual lines parallel to one another and which is activated only when the beam is scanning across said predetermined intersections, a current density, acceleration voltage, and local influence time of the electron beam being selected such that charge carrier pairs form in the gate insulating layer, negative charge carriers of the pairs flowing off to the semiconductor body connected to the reference voltage while positive charge carriers of the pairs remain in the gate insulating layer and charge it positively, a size of the positive charging being essentially determined by a product of the current density and influence duration of the electron beam.

2. The monolithically integrated read-only memory system according to claim 1 wherein a conducting layer is inserted into the gate insulating layer of the field effect transistor to stabilize a charge state of the same.

3. The monolithically integrated read-only memory system according to claim 1 wherein impurities are inserted into the gate insulating layer of the field effect transistor to stabilize a charge state of the same.

4. The monolithically integrated read-only memory system according to claim 1 wherein the field effect transistors at the selected intersections are designed as MNOS transistors whose gate insulating layers in each case comprise an $SiO_2$ layer and a $Si_3N_4$ layer lying adjacent thereto.

5. A system according to claim 1 wherein the semiconductor body is of P-conductivity and the means for selectively altering lowers the threshold voltage.

6. A method for programming a monolithically integrated read-only memory prior to use, comprising the steps of:
providing a plurality of word lines, a plurality of read lines which cross the word lines to form intersections, field effect transistors formed of a gate insulating layer on a semiconductor body being connected to the read and word lines at the intersections, and the transistors being connected to the selectable via the word lines and to function as coupling elements between the read lines and a circuit point carrying a reference potential;
programming the entire memory in read-only fashion prior to use and application of specific control voltages to the intersection transistors by selectively altering a charge state of the gate insulating layer of the transistors at certain predetermined selected intersections, the altered charge state determining whether or not the transistor is employed as a coupling element; and
to alter the charge state, deflecting an electron beam of a scanning electron beam writer over all of the intersection transistors of the semiconductor body along individual lines parallel to one another such that it selectively scans over channel regions of the selected field effect transistors, the electron beam being activated only when the beam is scanning across a selected intersection, a current density, influence duration, and acceleration voltage of the electron beam being selected such that it generates charge carrier pairs in the gate insulating layer, negative charge carriers of the pairs flowing off to the semiconductor body connected to a reference voltage while positive charge carriers of the pairs remain in the gate insulating layer and charge it positively which shifts the threshold voltage to a new value determinative of whether the transistor functions as a coupling element, the size of the positive charging being essentially determined by a product of the current density and influence duration of the electron beam.

7. A method for the programming of a monolithically integrated read-only memory prior to use comprising the steps of:
providing a plurality of word lines, a plurality of read lines which cross the word lines to form intersections, field effect transistors formed of a gate insulating layer on a semiconductor body being connected to the read and word lines at the intersections, and the transistors being connected to be selectable via the word lines and to function as coupling elements between the read lines and a circuit point carrying a reference potential; programming the entire memory in read-only fashion prior to use and application of specific control voltages to the intersection transistors by the steps of irradiating all field effect transistors provided at the intersections to provide a common displacement of their threshold voltage, a current density, influence duration and acceleration duration being selected such that in the gate insulating layers of the field effect transistors charge carrier pairs are generated, negative charge carriers of the pairs flowing off to the semiconductor body connected to a reference voltage while positive charge carriers of the pairs remain in the gate insulating layer and charge it positively, a size of the positive charging being essentially determined by a product of the current density and influence duration of the electron beam, and that following this, a selective irradiation of the channel regions of the field effect transistors which are not located at intersections selected for coupling takes place with an electron beam whose current density, influence duration and acceleration voltage are selected such that the gate insulating layers of these field effect transistors heat up to a temperature whereby they are again discharged so that the threshold voltages of these field effect transistors again assume their original value.

8. A method for the programming of a monolithically integrated read-only memory prior to use, comprising the steps of:

providing a plurality of word lines, a plurality of read lines which cross the word lines to form intersections, field effect transistors formed of a gate insulating layer on a semiconductor body being connected to the read and word lines at the intersections, and the transistors being connected to be selectable via the word lines and to function as coupling elements between the read lines and a circuit point carrying a reference potential; programming the entire semiconductor body prior to use and application of specific control voltages to the intersection transistors in read-only memory fashion by the steps of first negatively charging the gate insulating layers of all field effect transistors located at the intersections so that the field effect transistors experience a common shifting of their threshold voltages, and that following this, a selective irradiation of the channel regions of the field effect transistors located at selected intersections proceeds with an electron beam of an electron beam writer which is activated at the selected intersections, which scans over all of the intersection transistors of the semiconductor body along individual lines parallel to one another, and whose current density, influence duration and acceleration voltage are selected such that the gate insulating layers of these field effect transistors heat up to a temperature whereby they are again discharged so that these field effect transistors at the selected locations have a threshold voltage which corresponds to an original value present without the applied negative charge.

* * * * *